United States Patent
Gasparyan et al.

(10) Patent No.: US 8,959,474 B1
(45) Date of Patent: Feb. 17, 2015

(54) ROUTING MULTI-FANOUT NETS

(71) Applicant: Xilinx, Inc., San Jose, CA (US)

(72) Inventors: Grigor S. Gasparyan, San Jose, CA (US); Garik Mkrtchyan, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/243,813

(22) Filed: Apr. 2, 2014

(51) Int. Cl.
*G06F 17/50* (2006.01)
(52) U.S. Cl.
CPC ................... *G06F 17/5077* (2013.01)
USPC .......................................... 716/126; 716/129
(58) Field of Classification Search
USPC ................................. 716/126–131
See application file for complete search history.

(56) References Cited

U.S. PATENT DOCUMENTS

| | | | |
|---|---|---|---|
| 6,536,024 B1 * | 3/2003 | Hathaway | 327/295 |
| 6,557,145 B2 * | 4/2003 | Boyle et al. | 716/105 |
| 2009/0228851 A1 * | 9/2009 | Abbaspour et al. | 716/6 |
| 2009/0288050 A1 * | 11/2009 | Celik et al. | 716/6 |

OTHER PUBLICATIONS

"A* search algorithm", from Wikipedia encyclopedia, http://en.wikipedia.org/wiki/A*_search_algorithum, pp. 1-8, printed from website on Dec. 2, 2013.

* cited by examiner

*Primary Examiner* — Binh Tat
(74) *Attorney, Agent, or Firm* — Kevin T. Cuenot

(57) ABSTRACT

Routing a multi-fanout net includes selecting a driver component of the multi-fanout net of a circuit design, wherein the circuit design is specified programmatically, and determining a plurality of targets of the driver component. A source wave is created at each of a plurality of nodes of the driver component. One target is assigned to each source wave. Each source wave is expanded.

14 Claims, 6 Drawing Sheets

ROUTING MULTI-FANOUT NETS

FIELD OF THE INVENTION

This disclosure relates to integrated circuits (ICs) and, more particularly, to routing a circuit design to be implemented within an IC.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines, e.g., wires, of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

One aspect of implementing a circuit design within an IC, whether programmable or not, is routing. Routing refers to the process of determining and/or defining the particular circuitry that will electrically couple the various circuit components of the circuit design. For example, in the case of a programmable IC, routing includes selecting which routing resources are to be used to couple the various circuit blocks of the programmable IC as sources and loads, e.g., nets, to implement a circuit design.

Routing an FPGA circuit design can be particularly difficult. The interconnect circuitry of the FPGA is highly buffered, which leads to a significant number of timing critical, high fanout nets. Conventional routing techniques perform routing by operating upon each target of a multi-fanout net serially, one-by-one. This approach, however, may lead to sub-optimal routing of the circuit design and increased usage of routing resources such as interconnect circuitry and/or wires of the IC.

SUMMARY

A method includes selecting a driver component of a multi-fanout net of a circuit design, wherein the circuit design is specified programmatically, and determining a plurality of targets of the driver component. The method also includes creating a source wave at each of a plurality of nodes of the driver component, assigning, using a processor, one target of the plurality of targets to each source wave, and expanding, using the processor, source waves according to costs associated with the source waves.

Expanding source waves may include determining a child wave for a selected source wave and determining whether each child wave is located at the target of the selected source wave.

The method may include, responsive to determining that a child wave is located at a target of the selected source wave, instantiating a path from the target of the selected source wave to the node at which the source wave is located. The method may include continuing expansion of a different source wave assigned a target that is uncoupled by determining a further child wave of the different source wave.

In another aspect, each source wave is added to a priority queue. Accordingly, expanding source waves may include removing a selected wave from the priority queue having a lowest cost of waves stored in the priority queue and determining a child wave for the selected wave. The child wave inherits the target of the selected wave.

Expanding source waves further may include, responsive to determining that the child wave is located at the target of the selected wave, instantiating a path from the target of the selected wave to the node of the driver component at which the source wave, from which the child wave descends, is located, and removing each wave within the priority queue having a same target as the instantiated path.

The method may include creating a new source wave for each node of the instantiated path and for each node of the driver component not part of the instantiated path assigned to the target of the selected wave, assigning one target of the plurality of targets that remains uncoupled to each new source wave, and adding each new source wave to the priority queue.

A system includes a processor programmed to initiate executable operations. The executable operations include selecting a driver component of a multi-fanout net of a circuit design, wherein the circuit design is specified programmatically, determining a plurality of targets of the driver component, and creating a source wave at each of a plurality of nodes of the driver component. The executable operations also include assigning one target of the plurality of targets to each source wave and expanding source waves according to costs associated with the source waves.

Expanding source waves may include determining a child wave for a selected source wave and determining whether each child wave is located at the target of the source wave.

The processor further may be programmed to initiate executable operations including, responsive to determining that a child wave is located at a target of the selected source wave, instantiating a path from the target of the selected source wave to the node at which the source wave is located. The processor further may be programmed to initiate executable operations including continuing expansion of a different source wave assigned a target that is uncoupled by determining a further child wave of the different source wave.

In another aspect, each source wave is added to a priority queue. Accordingly, expanding the source waves may include removing a selected wave from the priority queue having a lowest cost of waves stored in the priority queue and determining a child wave for the selected wave. The child wave inherits the target of the selected wave.

Expanding source waves may include, responsive to determining that the child wave is located at the target of the selected wave, instantiating a path from the target of the selected wave to the node of the driver component at which the source wave, from which the child wave descends, is located, and removing each wave within the priority queue having a same target as the instantiated path.

The processor further may be programmed to initiate executable operations including creating a new source wave for each node of the instantiated path and for each node of the driver component not part of the instantiated path assigned to the target of the selected wave, assigning one target of the plurality of targets that remains uncoupled to each new source wave, and adding each new source wave to the priority queue.

A non-transitory computer-readable medium having instructions stored thereon which, when executed by a processor, performs a method. The method includes selecting a driver component of a multi-fanout net of a circuit design, wherein the circuit design is specified programmatically, determining a plurality of targets of the driver component, and creating a source wave at each of a plurality of nodes of the driver component. The method also includes assigning, using the processor, one target of the plurality of targets to each source wave and expanding, using the processor, source waves according to costs associated with the source waves.

Expanding source waves may include determining a child wave for a selected source wave and determining whether each child wave is located at the target of the selected source wave.

The method may include, responsive to determining that a child wave is located at a target of the selected source wave, instantiating a path from the target of the selected source wave to the node at which the selected source wave is located. The method may include continuing expansion of a different source wave assigned a target that is uncoupled by determining a further child wave of the different source wave.

In another aspect, each source wave is added to a priority queue. Accordingly, expanding source waves includes removing a selected wave from the priority queue having a lowest cost of waves stored in the priority queue and determining a child wave for the selected wave. The child wave inherits the target of the selected wave.

Expanding source waves further may include, responsive to determining that the child wave is located at the target of the selected wave, instantiating a path from the target of the selected wave to the node of the driver component at which the source wave, from which the child wave descends, is located, removing each wave within the priority queue having a same target as the instantiated path, creating a new source wave for each node of the instantiated path and for each node of the driver component not part of the instantiated path assigned to the target of the selected wave, assigning one target of the plurality of targets that remains uncoupled to each new source wave, and adding each new source wave to the priority queue.

BRIEF DESCRIPTION OF THE DRAWINGS

FIGS. 6-1 through 6-7 are block diagrams that, taken collectively, illustrate the exemplary routing technique of FIG. 3.

DETAILED DESCRIPTION OF THE DRAWINGS

While the disclosure concludes with claims defining novel features, it is believed that the various features described herein will be better understood from a consideration of the description in conjunction with the drawings. The process (es), machine(s), manufacture(s) and any variations thereof described within this disclosure are provided for purposes of illustration. Any specific structural and functional details described are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to routing a circuit design to be implemented within an IC. In accordance with the inventive arrangements described herein, a circuit design is routed using a wave expansion technique in which multiple waves are created and expanded concurrently for a multi-fanout net. Each wave created for the multi-fanout net is assigned a target of the multi-fanout net. Each wave is expanded according to costs assigned to the waves. Costs for taking particular paths to reach each respective target of the multi-fanout net can be determined dynamically on a per-wave basis as each wave expands to its target.

In addition, when a wave reaches a particular target, other wave expansions are retained and continue. As such, when a target is coupled to a driver component for a multi-fanout net, the wave expansion process does not begin anew. Rather, the routing process maintains previous wave expansions and continues processing existing wave expansions. Further, when a target is coupled to a driver component and a path between the driver component and the target is instantiated, new source waves are created at each of the nodes of the instantiated path and for each node of the driver component that is not part of the instantiated path, but which is assigned to the target of the instantiated path. Each new source wave is assigned a target that has not yet been coupled to the driver component. In one aspect, high cost wave expansions are not pursued while lower cost wave expansions are explored. Further aspects of routing multi-fanout nets are described below with reference to the drawings.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
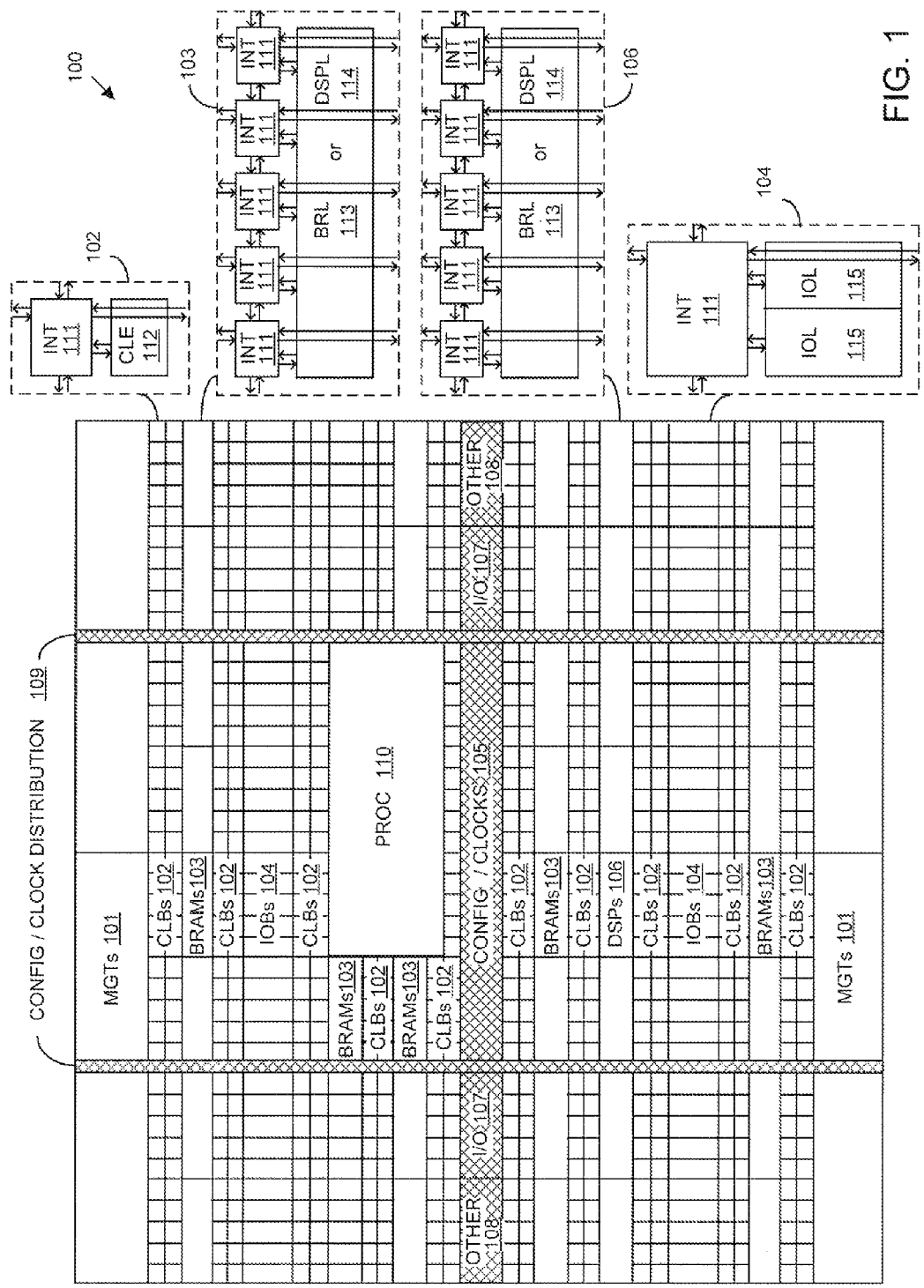
FIG. 1 is a block diagram illustrating an exemplary architecture for an integrated circuit (IC).

FIG. 1 is a block diagram illustrating an exemplary architecture 100 for an IC. In one aspect, architecture 100 is implemented within a field programmable gate array (FPGA) type of IC. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. As pictured, a BRAM tile has the same height as five CLBs, but other numbers (e.g., four) also can be used. A DSP tile 106 can include a DSP logic element (DSPL) 114 in addition to an appropriate number of INTs 111. An IOB 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107, and 108, can be used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block depicted as PROC 110 spans several columns of CLBs and BRAMs.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100 and replaced with one or more of the other varieties of the programmable blocks described. Further, such blocks can be utilized to form a "soft processor" in that the various blocks of programmable circuitry can be used to form a processor that can execute program code as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 103 and BRAMs 103 can be considered programmable circuitry of the IC.

In general, the functionality and connectivity of programmable circuitry is not established until configuration data is loaded into the IC. A set of configuration bits can be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 110 within the IC are for purposes of illustration only and are not intended as a limitation.

Figure 2:
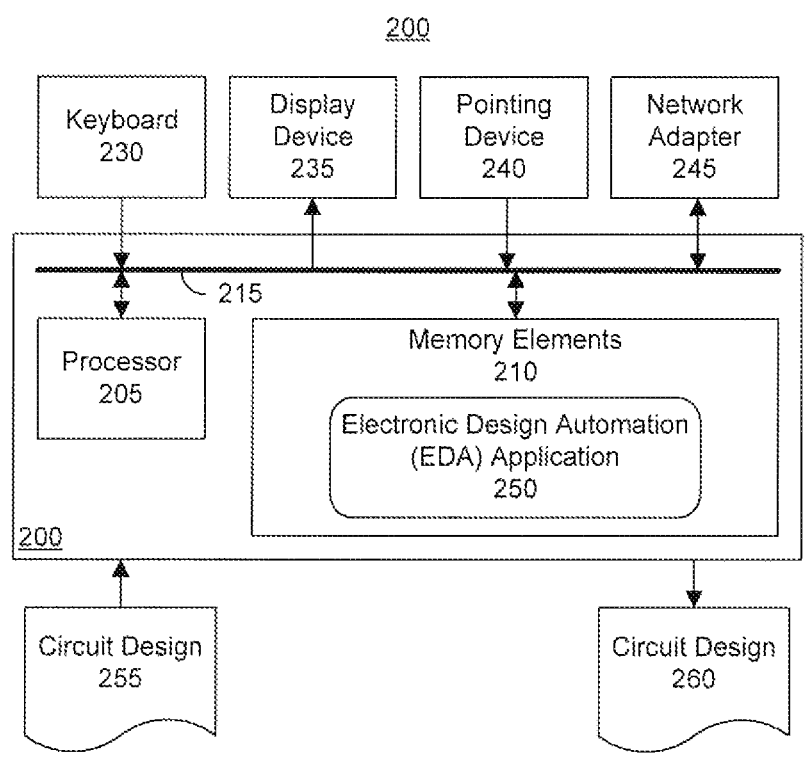
FIG. 2 is a block diagram illustrating an exemplary data processing system.

FIG. 2 is a block diagram illustrating an exemplary data processing system (system) 200. System 200 includes at least one processor, e.g., a central processing unit (CPU), 205 coupled to memory elements 210 through a system bus 215 or other suitable circuitry. System 200 stores program code within memory elements 210. Processor 205 executes the program code accessed from memory elements 210 via system bus 215. In one aspect, system 200 is implemented as a computer or other data processing system that is suitable for storing and/or executing program code. It should be appreciated, however, that system 200 can be implemented in the form of any system including a processor and memory that is capable of performing the functions described within this disclosure.

Memory elements 200 include one or more physical memory devices such as, for example, a local memory and one or more bulk storage devices. Local memory refers to random access memory or other non-persistent memory device(s) generally used during actual execution of the program code. The bulk storage device(s) can be implemented as a hard disk drive (HDD), solid state drive (SSD), or other persistent data storage device. System 200 also can include one or more cache memories (not shown) that provide temporary storage of at least some program code in order to reduce the number of times program code must be retrieved from the bulk storage device during execution.

Input/output (I/O) devices such as a keyboard 230, a display device 235, and a pointing device 240 optionally can be coupled to system 200. The I/O devices can be coupled to system 200 either directly or through intervening I/O controllers. A network adapter 245 also can be coupled to system 200 to enable system 200 to become coupled to other systems, computer systems, remote printers, and/or remote storage devices through intervening private or public networks. Modems, cable modems, Ethernet cards, and wireless transceivers are examples of different types of network adapter 245 that can be used with system 200.

As pictured in FIG. 2, memory elements 210 can store an electronic design automation (EDA) application 250. EDA application 250, being implemented in the form of executable program code, is executed by system 200. As such, EDA application 250 is considered part of system 200. System 200, while executing EDA application 250, receives and operates upon a circuit design 255. Circuit design 255 is a programmatic description of circuitry to be implemented within an IC. For example, circuit design 255 may be specified using a hardware description language, as a netlist, a combination thereof, or the like.

Circuit design 255 is at least partially unrouted. As such, system 200 operates upon circuit design 255 to perform routing for one or more multi-fanout nets within circuit design 255. System 200, in executing EDA application 250, determines and/or defines the routing resources, e.g., wires and wire connecting circuitry, and sequencing thereof to be used to couple driver circuit components and targets of one or more multi-fanout nets of circuit design 255. System 200 outputs circuit design 260, which includes one or more routed multi-fanout nets that were not routed in circuit design 255. For example, circuit design 260, which also is specified in programmatic form, includes or specifies routing information for one or more multi-fanout nets. EDA application 250, circuit design 255, circuit design 260, and any data items used, generated, and/or operated upon by EDA application 250 are functional data structures that impart functionality when employed as part of system 200 or when such elements, including derivations thereof, are loaded into an IC such as a programmable IC.

Figure 3:
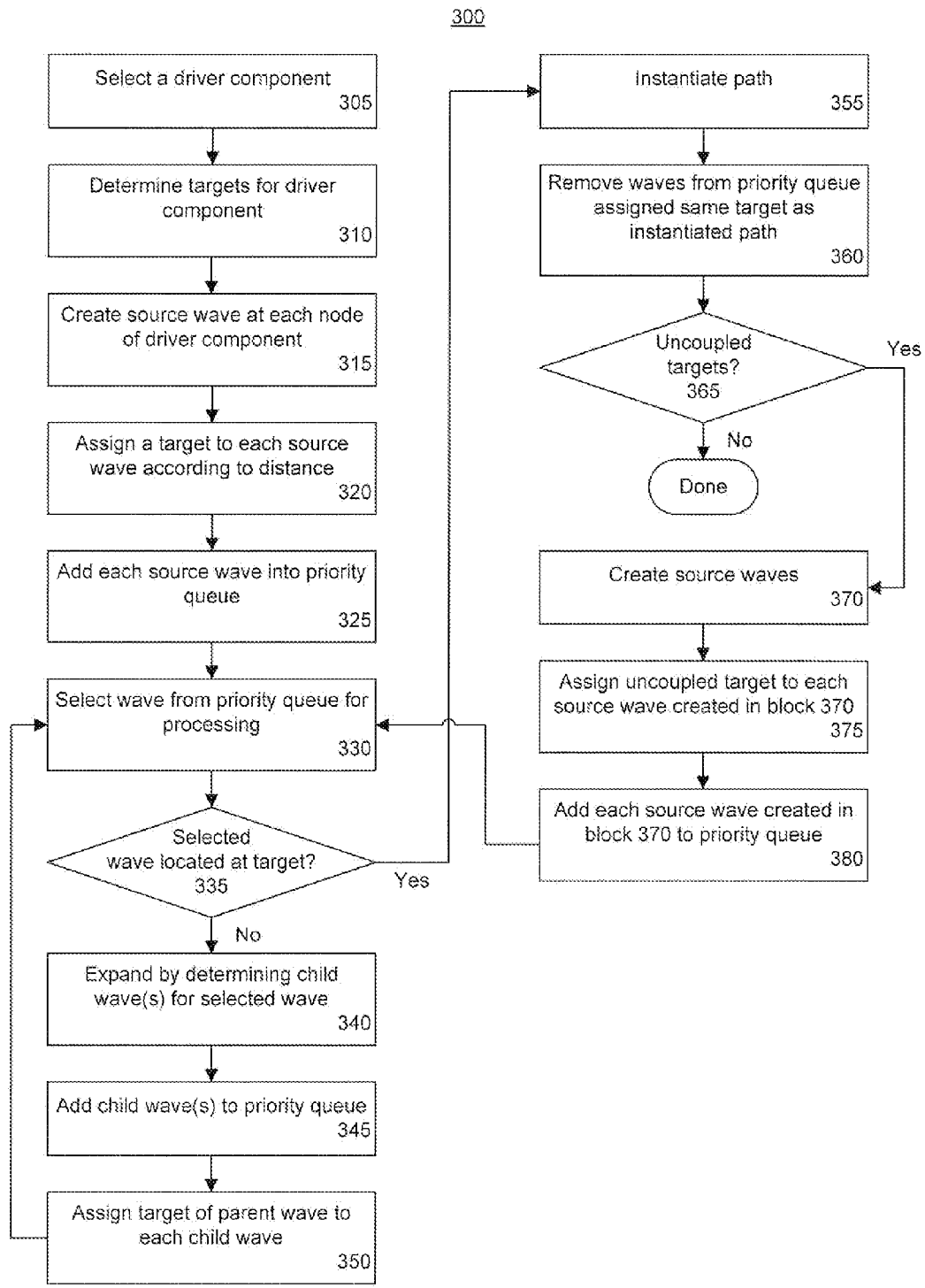
FIG. 3 is a flow chart illustrating an exemplary method of routing a multi-fanout net of a circuit design.

FIG. 3 is a flow chart illustrating an exemplary method 300 of routing a multi-fanout net of a circuit design. Method 300 can be performed by a system such as system 200 described with reference to FIG. 2. Accordingly, method 300 can begin in a state where a circuit design having one or more un-routed multi-fanout nets has been loaded into such a system.

In block 305, the system selects a driver component from the circuit design. The driver component is the source of a multi-fanout net. The phrase "driver component," as used within this disclosure, means one or more electrically equivalent nodes of a circuit design that serve as the source of a multi-fanout net. Each multi-fanout net is defined by a driver component and a plurality of targets of the driver component. A "target," as used within this disclosure, is a node of the circuit design that serves as a routing endpoint or destination of one of a plurality of signals of a multi-fanout net. In order to route the multi-fanout net, each target of the multi-fanout net must be coupled to a node of the driver component through a path formed of one or more routing resources.

In one aspect, the routing resources of an IC, e.g., wires, interconnects, and the like, are represented using a graph. The graph may be a mapping, model, or other representation of circuit elements and/or the routing resources of the particular IC in which the circuit design is to be implemented. The graph may be annotated with cost information. Cost information can include, but is not limited to, distance between nodes and/or wire length, an estimate of cost of a node, an estimate of delay of a node, node type (i.e., the type of physical resource, whether a particular type of circuit element and/or routing resource, represented by the node), the congestion of the node in reference to the number of other nets that would use the node for routing, a combination of one or more or all of the aforementioned items, or the like. Using the graph and the various factors noted above, the system can calculate a cost for using a particular node in establishing a connection from a driver component, or other node, to the target. For example, if the graph represents routing resources of an IC using a grid, a Manhattan distance is calculated to determine distance between nodes and, as such, the cost of a particular path formed of one or more routing resources. One or more other measures of cost may be used in lieu of distance, in combination with distance, etc., and used within a cost calculation expression or formula. It should be appreciated that Manhattan distance is provided for purposes of example only and, as such, is not intended as a limitation since other measures of distance may be used. An exemplary cost calculation expression is a summation of one or more of the various measures noted for a wave (e.g., a node at which the wave is located given the target assigned to the wave) where each measure has a weighting or multiplier that determines the relative importance of that measure within the expression.

In block 310, the system determines each of the plurality of targets for the driver component selected in block 305. In block 315, the system creates a source wave at each node of the driver component. A "wave," as used within this disclosure, indicates a node of the circuit design that is considered for inclusion in a path between the driver component and a target of a multi-fanout net to which the driver component belongs. In general, signal path exploration extends outward from the location of the wave and is called "wave expansion" or "expansion." For purposes of illustration within this disclosure, each expansion of a wave is labeled and/or considered a new "child" wave of the prior wave being expanded, which may be referred to as the "parent" wave. A "source wave" refers to a wave created for exploration at a node of the multi-fanout net that has no parent wave. Each "child" wave is considered an expansion of a parent wave.

In block 320, the system assigns a target to each source wave. One target is assigned to each source wave based upon distance between the target and the source wave. At least initially, each target of the multi-fanout wave is presumed to be uncoupled from the driver component. A target that is not coupled to a driver component may be said to be "unconnected," "not connected," or "not routed." Thus, in one aspect, the uncoupled target closest to a source wave is assigned to that source wave. It should be appreciated that, at least initially, not all targets of the multi-fanout net may be assigned to a source wave. Further, a same target may be assigned to more than one source wave. As method 300 continues, however, new paths are added and new source waves created. Thus, targets not initially assigned to a wave eventually are assigned to a wave resulting in all targets of the multi-fanout net being considered and/or processed.

In one aspect, the system assigns targets to each source wave by creating a quadtree type of data structure. The quadtree data structure stores all active targets and allows the system to quickly identify the closest target to any given source wave. The complexity of this operation is logarithmic with respect to numbers of targets. Quadtrees may be used to partition and/or evaluate a two-dimensional space for routing nets by recursively subdividing the space into four quadrants or regions. The regions may be square or rectangular, or may have arbitrary shapes.

In block 325, the system adds, or pushes, each source wave into a priority queue. A "priority queue," as used within this disclosure, is a list of waves, whether source waves or child waves, that are candidates for expansion and/or processing. In one aspect, the priority queue sorts waves stored therein according to cost. In block 330, the system selects a wave from the priority queue for processing, e.g., expansion. For example, in selecting a wave from the priority queue, the system pops the selected wave from the priority queue, thereby removing the wave from the priority queue. The selected wave, i.e., the wave that is popped, is the wave having the lowest cost of all waves stored in the priority queue.

In one aspect, when a wave is in the priority queue, the wave is not guaranteed to be selected for processing since the system is configured to select the wave having the lowest cost for processing. For example, consider the case in which a same target is assigned to each of waves W1 and W2. The cost of wave W2 in determining a path to the target is less than the cost of wave W1 for the target. The system is configured to select the wave having the lowest cost, whether for the same target or not, of all waves stored in the priority queue. Thus, wave W2 is selected for processing while wave W1 remains in the priority queue unprocessed.

In block 335, the system determines whether the selected wave popped from the priority queue in block 330 is the target assigned to the selected wave. More particularly, the system determines whether the node at which the selected wave is located is the target assigned to the selected wave. If so, method 300 continues to block 355. If not, method 300 proceeds to block 340.

Continuing with block 340, the system processes, or expands, the selected wave. The system expands the selected wave by determining a child wave, or waves, for the selected wave. More particularly, the system determines any nodes that are adjacent to the selected wave. It should be appreciated that any reference to distance, adjacent nodes, or location of a wave refers to the particular node of the circuit design at which the wave is created and/or located. At each adjacent node, the system creates a child wave. In one aspect, the system may not create a child wave at an adjacent node in cases where the adjacent node already has a wave of smaller cost than the child wave that would be created. By not creating a child wave at the adjacent node in such a circumstance, additional processing relating to adding the child wave to the priority queue is avoided since the system is certain that the child wave would not be selected for processing. In another aspect, however, the system may create a child wave at the adjacent node regardless of the existence of any other waves at the node and the cost of such waves.

In block 345, the system adds each child wave created in block 340 to the priority queue, e.g., stores each such child wave in the priority queue. In block 350, each child wave inherits the target of its parent wave. More particularly, the system assigns the target of the selected wave of block 330 to each child wave created in block 340. As such, both parent and child waves have a same target. After block 350, method 300 loops back to block 330 to continue processing.

Proceeding with block 355 in the case where the selected wave is the target, the system instantiates the path. The system instantiates the current path being constructed since the target of the path has been reached. The term "path" or "signal path," as used within this disclosure, means each node of the circuit design starting from, and including, the target, continuing and including each parent wave, up to and including the node at which a source wave is located, e.g., in the driver component. The source wave, following parent waves as described, is an ancestor of the target such that the child wave located at the target is considered to be a descendant of, or is said to descend from, the source wave. The path is defined from target back to the node of the driver component since each child wave has one, unique parent wave, but each parent wave may have more than one child wave. The path specifies the routing resources used for routing a signal of the multi-fanout net. The term "instantiate," as applied to a signal path or path within this disclosure, means storing the collection of nodes as the specific route and set of routing resources for conducting an electrical signal from the node of the driver component to the target for the multi-fanout net. Routing resources utilized for an instantiated path, for example, are not available to route other nets in order to ensure that any determined route is legal. A "legal" routing solution, as defined within this disclosure, means that each node is used by only one net. During routing, however, the same routing resource may be used by multiple nets which imposes additional cost. During rip-up and reroute operations of the routing process, the additional cost, i.e., penalty, is gradually increased until conflicts between the nets are removed and the routing resource is used by only one net. When a target of the multi-fanout net is reached, the target is said to be coupled or connected.

As an example, consider the case in which the priority queue returns a wave W1 during expansion since wave W1 has the smallest cost of all other waves stored in the priority queue. As the child waves of wave W1 are determined, the system calculates the cost of each child wave using a cost expression. Eventually, child nodes have sufficiently high enough costs that the new waves pushed onto the priority queue will not be popped. In illustration, there are two possible paths from the node at which wave W1 is located to the target node. The first path is W1→node B→target. The second path is W1→node C→node D→node E→target. If there are two other nets attempting to use node B, the cost of node B may be higher than the combined costs of nodes C, D, and E. In that case, the system determines child waves, pushes child waves, and pops child waves with respect to the priority queue to take the second path to the target.

In block 360, the system removes each wave from the priority queue that is assigned a same target as the path instantiated in block 355. Since a path for the target has been instantiated, any other waves having the same target still within the priority queue need not be processed or expanded and are removed.

In block 365, the system determines whether any uncoupled targets remain in the priority queue. If so, method 300 continues to block 370 to continue processing. If not, method 300 can end as the multi-fanout net is routed.

In block 370, the system creates source waves. The system creates a source wave at each node of the instantiated path. Further, the system creates a source wave at each node of the driver component that is not part of the instantiated path that had the same target as the instantiated path. In block 375, the system assigns an uncoupled target to each source wave created in block 370. As discussed, distance can be used to assign targets to the source waves. In block 380, the system adds, e.g., stores, each source wave created in block 370 to the priority queue. After block 380, the system loops back to block 330 to select a next wave for processing.

As discussed, the system selects the next wave for processing using a cost-based approach. For example, consider the case in which waves W1, W2, and W3 are in the priority queue. Each of waves W1, W2, and W3 may or may not have a different target. During a first iteration of method 300, and, in particular, in blocks 330, 335, 340, 345, and 350, the system processes wave W1, e.g., selects, pops, and expands wave W1 presuming that wave W1 has a lowest cost of all waves stored in the priority queue. Any child waves for W1 are added to the priority queue. The child waves for wave W1 are sorted within the priority queue according to cost. During the next iteration, the system selects the wave of the priority queue having the lowest cost, which may be wave W2, wave W3, or any of the child waves of wave W1.

By expanding each wave of the multi-fanout net according to cost, each signal of the multi-fanout net may be routed in a concurrent manner. For example, one signal is not guaranteed to be routed from the driver component to the target without expanding waves having other targets of the multi-fanout net. The waves created and expanded for the different signals of the multi-fanout net are retained and continued to be expanded even when a target is reached. As such, the system is not routing one entire signal from driver component to target, purging existing wave expansions, and starting to route a new signal of the multi-fanout net by beginning wave expansion anew as is the case in conventional routing techniques.

The exemplary routing technique described with reference to FIG. 3 can be varied in that one or more steps may be performed in a different order than described. As an example, the determination of whether a wave is a target may be performed at a different point in time than illustrated in FIG. 3. If performed immediately upon determination of a child wave, for example, the system need not put a child wave determined to be a target into the priority queue. The method described with reference to FIG. 3 can be performed as part of routing multi-fanout nets, which can include ripping up existing nets and re-routing such nets or parts thereof.

Figure 4:
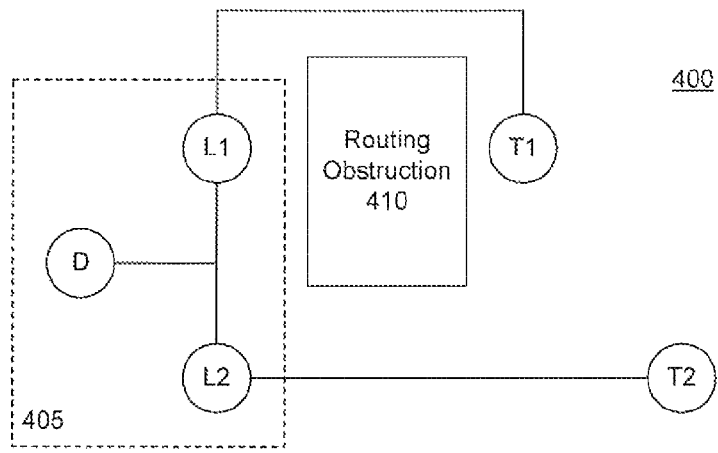
FIG. 4 is a block diagram illustrating a routing solution for a multi-fanout net of a circuit design determined using a conventional routing technique.

FIG. 4 is a block diagram illustrating a routing solution for a multi-fanout net of a circuit design determined using a conventional routing technique. FIG. 4 illustrates portion of a circuit design implemented as circuitry 400 within an IC. Circuitry 400 includes a driver component 405 that includes a driver node (D), a first load node (L1), and a second load node (L2). As discussed, each of nodes D, L1, and L2 are considered equivalent. Per the circuit design, driver component 405 is to be connected to each of the target nodes T1 and T2. A routing obstruction 410 is located between driver component 405 and target T1. The routing obstruction may be a processor or other type of circuitry through which a signal of a multi-fanout net may not be routed.

A conventional wave expansion router using the A* search algorithm will generate a result similar to that shown in FIG. 4. Such is the case since the router will sort the targets according to distance from the driver component to each respective target. Each target is routed in its entirety before starting to route the other target. In this example, target T1 is closer to driver component 405 than is target T2. The actual routing from the driver component to target T1 is longer due to routing obstruction 410. Accordingly, the signal to target T1 is routed first, in its entirety, prior to routing the signal to target T2. After routing target T1, the entire wave expansion, or set of waves, created for routing target T1 is discarded and a wave expansion is then started anew to route target T2. Further, since the distance from target T1 to target T2 is larger than the distance from node L2 to target T2, an independent path is created from node L2 to target T2. This results in a suboptimal usage of routing resources and an increased number of expansions.

Figure 5:
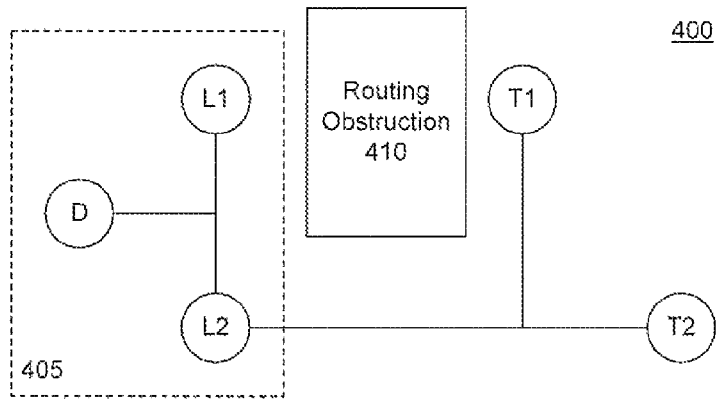
FIG. 5 is a block diagram illustrating a routing solution for a multi-fanout net of a circuit design determined using the exemplary method of FIG. 3.

FIG. 5 is a block diagram illustrating a routing solution for a multi-fanout net of a circuit design determined using the exemplary method described with reference to FIG. 3. FIG. 5 illustrates routing of circuitry 400 which, as noted, includes a driver component 405 having a driver node (D), a first load node (L1), and a second load node (L2). Driver component 405 is to be connected to each of the target nodes T1 and T2. A routing obstruction 410 is located between driver component 405 and target T1.

As discussed with reference to FIG. 3, a source wave is created for each of nodes L1 and L2. The most appropriate target is identified for each source wave created at the nodes of driver component 405. Distance is used to assign targets to the source waves. Since target T1 is closest to node L1, the system assigns target T1 to the source wave created at load L1. Target T2 is closest to load L2. Accordingly, the system assigns target T2 to the source wave located at load L2.

One consequence of creating multiple source waves, assigning a target to each such wave, and expanding each wave concurrently compared to conventional routing techniques in which targets are routed statically, one-by-one is improved quality of routing. Referring again to FIG. 5, application of the exemplary routing technique of FIG. 3 results in the creation of a path from node L2 to target T2. Further, target T1 is connected to the path instantiated between node L2 and target T2. This occurs because the distance from node L1 to target T1 is larger than the distance from target T1 to the newly instantiated path. The path from target T1 to the instantiated path between node L2 and target T2 is instantiated.

As previously noted, in accordance with the inventive arrangements disclosed herein, wave expansion for all uncoupled targets of the multi-fanout net is retained even after a target is coupled by storing waves having unconnected targets in the priority queue. Retention of waves assigned uncoupled targets often results in a substantial reduction in time required to route the circuit design, i.e., a substantial reduction in router runtime, compared to conventional routing techniques. For example, fewer wave expansions are required compared with the example of FIG. 4.

Further, the inventive arrangements provide for more accurate timing cost computation for each expansion wave that accounts for the properties of the target of the wave. More particularly, since each wave is assigned a target, the properties of the target are known and considered for purposes of cost calculation for each wave and/or wave expansion. As such, critical targets may have a more direct and faster route than another non-critical target. Further, since each target of the multi-fanout net is routed concurrently, cost information for the paths being developed to each uncoupled target is calculated, stored, and remains available for the duration of the multi-fanout routing process to influence routing to such targets. Otherwise, routing resources needed for routing a signal of the multi-fanout net to a critical target may be utilized to route a signal to a non-critical target of the multi-fanout net.

Figures 1, 6:
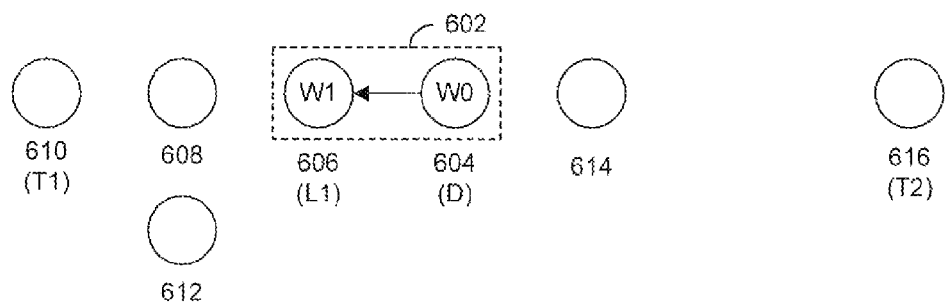
Figures 2, 6:
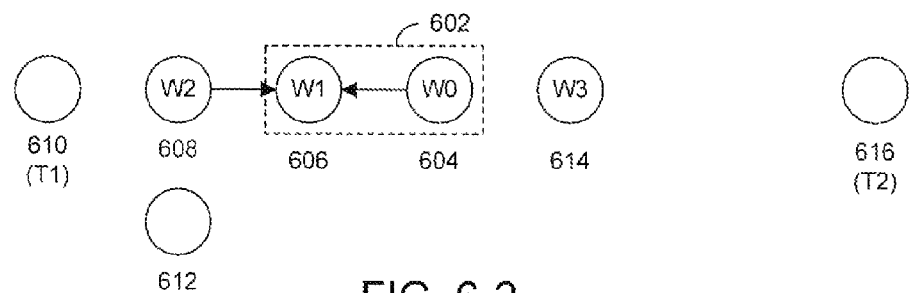
Figures 3, 6:
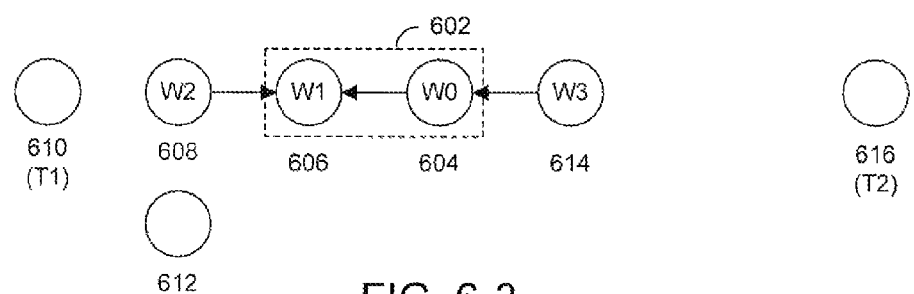
Figures 4, 6:
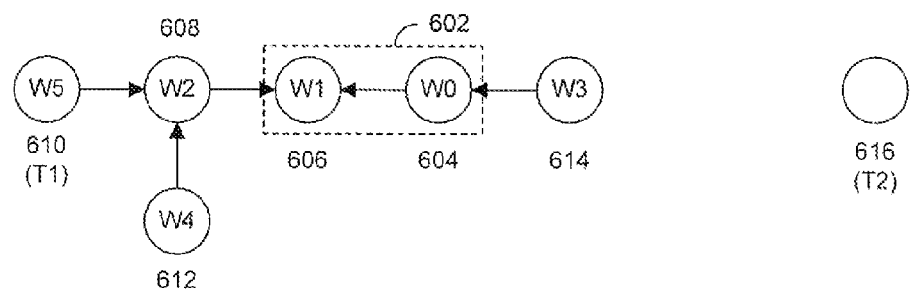
Figures 5, 6:
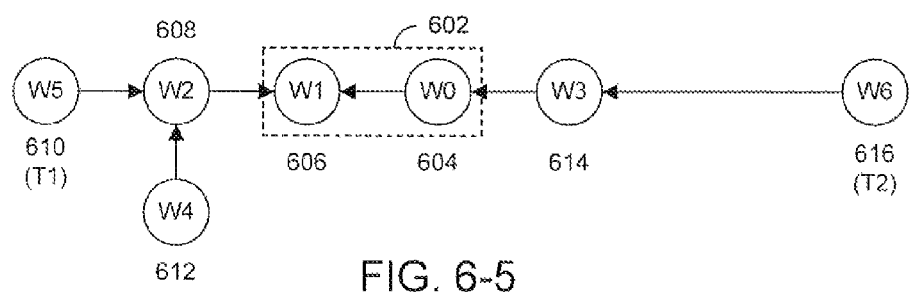
Figure 6:
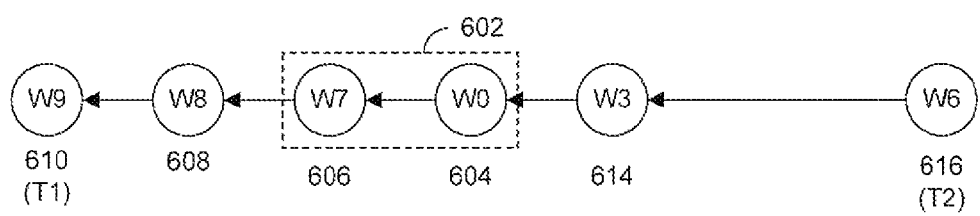
Figures 6, 7:
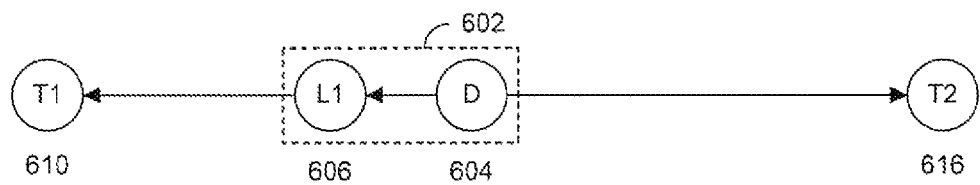

FIGS. 6-1 through 6-7 are block diagrams that, taken collectively, illustrate the exemplary routing technique described with reference to FIG. 3. Referring to FIG. 6-1, a portion of circuitry is shown including multi-fanout net that is to be routed. The multi-fanout net includes a driver component 602, a target T1, and a target T2. Driver component 602 includes a driver node 604 and a load node 606. Further nodes of the circuit design are illustrated as 608, 610, 612, 614, and 616. The various nodes represent routing resources, e.g., wires and/or interconnect circuitry, as well as the target nodes or circuit components. Per the circuit design, driver component 602 is to be connected to target T1 located at node 610 and to a target T2 corresponding to node 616.

The system selects the multi-fanout net for routing, e.g., driver component 602. Targets of driver component 602 are determined. Accordingly, the system creates a source wave W0 at node 604 of driver component 602 and a source wave W1 at node 606 of driver component 602. For purposes of discussion, the location of a wave, whether a source wave or a child wave, is the particular node at which the wave is created. Thus, the location of wave W0, for example, is node 604, or is the same as node 604. With this in mind, the term "wave" may be used within this disclosure in reference to either a wave having the referenced name or the node at which the referenced wave is located. For example, the term "wave W0" may be used to refer to either wave W0 or to node 604. In some cases, a node may have more than one wave assigned thereto as the node may be reached from different nodes and/or directions. Two or more waves located at a same node have independently calculated costs as each wave may or may not have the same target and may have different parent waves. As such, waves are still popped from the priority queue according to lowest cost. Reference to a target also refers to the node at which the target is located. For example, the term "target T1" may be used to refer to node 610. The term "target T2" may be used to refer to node 616.

In any case, responsive to creating source waves 604 and 606, the system assigns a target to each source wave. As discussed, targets of the multi-fanout net are assigned to source waves according to distance. Since the distance between wave W1 and target T1 is less than the distance between wave W0 and target T1, the system assigns target T1, i.e., node 610, to wave W1. Similarly, since the distance between wave W0 and target T2, i.e., node 616, is less than the distance between wave W1 and target T2, target T2 is assigned to wave W0. The system further pushes each of source waves W0 and W1 onto the priority queue. Accordingly, the priority queue includes, or specifies, waves W0 and W1.

Referring to FIG. 6-2, the system selects wave W1 thereby popping wave W1 from the priority queue. Wave W1 is presumed to have the lowest cost among waves W0 and W1 in the priority queue. Removing wave W1 leaves only wave W0 in the priority queue. In one aspect, the system determines that wave W1 is not the target assigned thereto. The system processes wave W1 by determining a node, or nodes, at which child wave(s) are to be created for wave W1. In particular, the system locates node 608 as a node that is adjacent to wave W1.

The system creates wave W2, which is a child wave of wave W1, at node 608. For purposes of discussion, arrows in FIG. 6 point from child wave to parent wave until the target is coupled to source component 602 and the path is instantiated. Once instantiated, arrows change direction and point from a node of driver component 602 to the appropriate target. Responsive to creating wave W2, the system assigns target T1 to wave W2 since wave W2 is the child of wave W1 and each child wave inherits the target of the parent wave. Further, the system pushes wave W2 onto the priority queue. At this point, the priority queue includes waves W0 and W2.

Referring to FIG. 6-3, the system next selects wave W0 for processing. Wave W0 has the lowest cost of all waves in the priority queue, i.e., a lower cost than wave W2. Accordingly, the system pops wave W0 from the priority queue, leaving only wave W2 in the priority queue. The system processes wave W0 by determining a node, or nodes, at which child wave(s) are to be created for wave W0. The system locates node 614 as a node adjacent to wave W0 in the direction of target T2. The system creates wave W3, which is a child wave of wave W0, at node 614. Responsive to creating wave W3, the system assigns target T2 to wave W3. Further, the system pushes wave W3 onto the priority queue. As such, the priority queue includes waves W2 and W3.

Referring to FIG. 6-4, the system selects wave W2. Wave W2 has the lowest cost of all waves in the priority queue. Wave W2 has a cost lower than that of wave W3. The system pops wave W2 from the priority queue, leaving only wave W3 in the priority queue. Responsive to popping wave W2 from the priority queue, the system determines whether wave W2, e.g., node 608, is target T1 or located at target T1.

Responsive to determining that wave W2 is not target T1, the system processes wave W2 by determining a node, or nodes, adjacent to wave W2. The system locates node 610 and node 612 as being nodes adjacent to wave W2. The system creates waves W4 and W5, which are child waves of wave W2, at nodes 612 and nodes 610, respectively. Responsive to creating wave W4 and wave W5, the system assigns target T1 to each of waves W4 and W5. Further, the system pushes waves W4 and W5 onto the priority queue. As such, the priority queue includes waves W3, W4, and W5.

Referring to FIG. 6-5, the system next selects wave W3 for processing. Wave W3 has the lowest cost of all waves stored in the priority queue. Accordingly, the system pops wave W3 from the priority queue, leaving only waves W4 and W5 in the priority queue. Responsive to popping wave W3 from the priority queue, the system determines whether wave W3, e.g., node 614, is target T2 or located at target T2.

Responsive to determining that wave W3 is not target T2, the system processes wave W3 by determining a node, or nodes, adjacent to wave W3. The system locates node 616 as being a node adjacent to wave W3. The system creates wave W6 at node 616. Wave W6 is a child wave of wave W3. Responsive to creating wave W6, the system assigns target T2 to wave W6. Further, the system pushes wave W6 onto the priority queue. As such, the priority queue includes waves W4, W5, and W6.

Referring to FIG. 6-6, the system next selects wave W5 (not shown) for processing. Wave W5 has the lowest cost of all waves stored in the priority queue. The system pops wave W5 from the priority queue, leaving only waves W4 and W6 in the priority queue. Responsive to popping wave W5 from the priority queue, the system determines whether wave W5, e.g., node 610, is target T1. Responsive to determining that wave W5 is target T1, the system instantiates the path formed of nodes 610, 608, and 606, thereby establishing a connection, or a coupling, in the circuit design between driver component 602 and target T1. Because paths are instantiated from target to driver component, node 612 is not included as it is not a parent of wave W5. The instantiated path specifies or defines each routing resource, per the nodes of the path, used to couple target T1 with driver component 602, e.g., from target to the source wave that is the ancestor of the child wave located at the target. After instantiating the path between, and connecting, node 606 with node 610, any waves also assigned to target T1 that remain in the priority queue are removed. Accordingly, wave W4 is removed from the priority queue. Other waves, e.g., wave W6, remain in the priority queue despite reaching target T1. Accordingly, only wave W6 remains in the priority queue since the target T2, which is assigned to wave W6, is not yet coupled to driver component 602.

Responsive to reaching target T1 and/or instantiating the path, the system creates a new source wave at each node of the instantiated path. Thus, as pictured in FIG. 6-6, the system creates source waves W7, W8, and W9 at nodes 606, 608, and 610, respectively. Each of waves W7, W8, and W9 are pushed onto the priority queue. A target of the multi-fanout net not yet coupled is assigned to each of waves W7, W8, and W9. In this example, only target T2 remains uncoupled. Accordingly, target T2 is assigned to each of waves W7, W8, and W9. As such, the priority queue includes waves W6, W7, W8, and W9. FIG. 6-6 reflects the state of the multi-fanout net after the path between driver component 602 and target T1 is instantiated and source waves W7, W8, and W9 have been created.

Though not illustrated in FIG. 6-6, were other nodes of driver component 602 to have source waves having the target T1, such source waves would be assigned target T2 responsive to instantiation of the path to target T1. For example, were driver component 602 to have included an additional node having a source wave with target T1 assigned thereto, the system would create a new source wave at the additional node and assign target T2 to the source wave responsive to instantiating the path to target T1.

Referring to FIG. 6-7, the system next selects wave W6 (not shown) since wave W6 is the lowest cost of all waves in the priority queue. The system pops W6 from the priority queue, leaving only waves W7, W8, and W9 in the priority queue. Responsive to popping wave W6 from the priority queue, the system determines whether wave W6, e.g., node 616, is target T2. Responsive to determining that wave W6 is target T2, the system instantiates the path formed of nodes 604, 614, and 616, thereby coupling driver component 604 and target T2. After instantiating the path between, and connecting, node 604 with node 616, any waves to which target T2 has been assigned that remain in the priority queue are removed. Accordingly, waves W7, W8, and W9 are removed from the priority queue leaving no further waves of the multi-fanout net for processing.

In accordance with the inventive arrangements disclosed herein, a routing technique is provided in which a plurality of source waves are created at nodes of a driver component. A target is assigned to each source wave. The waves are expanded concurrently according to cost with each child wave being assigned the target of the parent wave. When a target is coupled to the driver component, a path, e.g., a new portion of the routing tree, is instantiated. Further, new source waves are created at each node of the instantiated path and at each node of the driver component at which a source wave was located also having the target of the instantiated path. For each newly created source wave, a target is assigned thereto. Waves still in the priority queue are evaluated and any waves assigned targets that are coupled are removed.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects described within this disclosure can be realized in hardware or a combination of hardware and software. One or more aspects can be realized in a centralized fashion in one system or in a distributed fashion where different elements are spread across several interconnected systems. Any kind of data processing system or other apparatus adapted for carrying out at least a portion of the methods described herein is suited.

One or more aspects further can be embedded in a computer program product, which includes all the features enabling the implementation of the methods described herein. The computer program product includes a data storage medium which is a non-transitory computer-usable or computer-readable medium, storing program code that, when loaded and executed in a system including a processor, causes the system to initiate and/or perform at least a portion of the functions and/or operations described within this disclosure. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this disclosure, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

The features described within this disclosure can be embodied in other forms without departing from the spirit or essential attributes thereof. Accordingly, reference should be made to the following claims, rather than to the foregoing disclosure, as indicating the scope of such features and implementations.

What is claimed is:

1. A method of routing a multi-fanout net of a circuit design, comprising:
   selecting a driver component of the multi-fanout net of the circuit design, wherein the circuit design is specified programmatically;
   determining a plurality of targets of the driver component;
   creating a source wave at each of a plurality of nodes of the driver component;
   wherein a wave specifies a node of a circuit design considered for inclusion in a path between the driver component and a target of the multi-fanout net and a source wave is a wave with no parent wave;
   assigning, using a processor, one target of the plurality of targets to each source wave; and
   expanding, using the processor, the source waves according to costs associated with the source waves, wherein expanding the source waves further comprises:
   determining a child wave for a selected source wave;
   determining whether each child wave is located at the target of the selected source wave; and
   responsive to determining that a child wave is located at a target of the selected source wave, instantiating a path from the target of the selected source wave to the node at which the selected source wave is located.

2. The method of claim 1, further comprising:
   continuing expansion of a different source wave assigned a target that is uncoupled by determining a further child wave of the different source wave.

3. The method of claim 1, wherein each source wave is added to a priority queue, and wherein expanding the source waves further comprises:
   removing a selected wave from the priority queue having a lowest cost of waves stored in the priority queue; and
   determining a child wave for the selected wave;
   wherein the child wave inherits the target of the selected wave.

4. The method of claim 3, wherein expanding the source waves further comprises:
   responsive to determining that the child wave is located at the target of the selected wave, instantiating a path from the target of the selected wave to the node of the driver component at which the source wave, from which the child wave descends, is located, and removing each wave within the priority queue having a same target as the instantiated path.

5. The method of claim 4, further comprising:
   creating a new source wave for each node of the instantiated path and for each node of the driver component not part of the instantiated path assigned to the target of the selected wave;
   assigning one target of the plurality of targets that remains uncoupled to each new source wave; and
   adding each new source wave to the priority queue.

6. A system, comprising:
   a processor programmed to initiate executable operations for routing a multi-fanout net of a circuit design, the executable operations comprising:
   selecting a driver component of the multi-fanout net of the circuit design, wherein the circuit design is specified programmatically;
   determining a plurality of targets of the driver component;
   creating a source wave at each of a plurality of nodes of the driver component;
   wherein a wave specifies a node of a circuit design considered for inclusion in a path between the driver component and a target of the multi-fanout net and a source wave is a wave with no parent wave;
   assigning one target of the plurality of targets to each source wave; and
   expanding the source waves according to costs associated with the source waves, wherein expanding the source waves further comprises:
   determining a child wave for a selected source wave;
   determining whether each child wave is located at the target of the selected source wave; and responsive to determining that a child wave is located at a target of the selected source wave, instantiating a path from the target of the selected source wave to the node at which the selected source wave is located.

7. The system of claim 6, wherein the processor is further programmed to initiate executable operations comprising:
continuing expansion of a different source wave assigned a target that is uncoupled by determining a further child wave of the different source wave.

8. The system of claim 6, wherein each source wave is added to a priority queue, and wherein expanding the source waves further comprises:
removing a selected wave from the priority queue having a lowest cost of waves stored in the priority queue; and
determining a child wave for the selected wave;
wherein the child wave inherits the target of the selected wave.

9. The system of claim 8, wherein expanding each source wave further comprises:
responsive to determining that the child wave is located at the target of the selected wave, instantiating a path from the target of the selected wave to the node of the driver component at which the source wave, from which the child wave descends, is located, and removing each wave within the priority queue having a same target as the instantiated path.

10. The system of claim 9, wherein the processor is further programmed to initiate executable operations comprising:
creating a new source wave for each node of the instantiated path and for each node of the driver component not part of the instantiated path assigned to the target of the selected wave;
assigning one target of the plurality of targets that remains uncoupled to each new source wave; and
adding each new source wave to the priority queue.

11. A non-transitory computer-readable medium having instructions stored thereon which, when executed by a processor, perform a method of routing a multi-fanout net of a circuit design, comprising:
selecting a driver component of the multi-fanout net of the circuit design, wherein the circuit design is specified programmatically;
determining a plurality of targets of the driver component;
creating a source wave at each of a plurality of nodes of the driver component;
wherein a wave specifies a node of a circuit design considered for inclusion in a path between the driver component and a target of the multi-fanout net and a source wave is a wave with no parent wave;
assigning, using the processor, one target of the plurality of targets to each source wave; and
expanding, using the processor, the source waves according to costs associated with the source waves, wherein expanding the source waves further comprises:
determining a child wave for a selected source wave;
determining whether each child wave is located at the target of the selected source wave; and
responsive to determining that a child wave is located at a target of the selected source wave, instantiating a path from the target of the selected source wave to the node at which the selected source wave is located.

12. The non-transitory computer-readable medium of claim 11, wherein the method further comprises:
continuing expansion of a different source wave assigned a target that is uncoupled by determining a further child wave of the different source wave.

13. The non-transitory computer-readable medium of claim 11, wherein each source wave is added to a priority queue, and wherein expanding the source waves further comprises:
removing a selected wave from the priority queue having a lowest cost of waves stored in the priority queue; and
determining a child wave for the selected wave;
wherein the child wave inherits the target of the selected wave.

14. The non-transitory computer-readable medium of claim 13, wherein expanding each source wave further comprises:
responsive to determining that the child wave is located at the target of the selected wave, instantiating a path from the target of the selected wave to the node of the driver component at which the source wave, from which the child wave descends, is located, and removing each wave within the priority queue having a same target as the instantiated path;
creating a new source wave for each node of the instantiated path and for each node of the driver component not part of the instantiated path assigned to the target of the selected wave;
assigning one target of the plurality of targets that remains unconnected to each new source wave; and
adding each new source wave to the priority queue.

* * * * *